(12) United States Patent
Chen

(10) Patent No.: US 7,294,025 B1
(45) Date of Patent: Nov. 13, 2007

(54) HIGH PERFORMANCE JACK

(75) Inventor: Chou-Hsing Chen, Liutu Industrial Zone Keelung (TW)

(73) Assignee: Surtec Industries, Inc. (TW)

( * ) Notice: Subject to any disclaimer, the term of this patent is extended or adjusted under 35 U.S.C. 154(b) by 0 days.

(21) Appl. No.: 11/379,712

(22) Filed: Apr. 21, 2006

(51) Int. Cl.
*H01R 24/00* (2006.01)

(52) U.S. Cl. .................. 439/676; 439/76.1; 439/941

(58) Field of Classification Search ............. 439/344, 439/676, 941, 76.1, 188
See application file for complete search history.

(56) References Cited

U.S. PATENT DOCUMENTS

| | | | |
|---|---|---|---|
| 6,350,158 B1 * | 2/2002 | Arnett et al. ............ | 439/676 |
| 6,547,604 B2 * | 4/2003 | Arnett et al. ............ | 439/676 |
| 7,175,476 B2 * | 2/2007 | Kim et al. ............. | 439/620.11 |

* cited by examiner

*Primary Examiner*—Khiem Nguyen
(74) *Attorney, Agent, or Firm*—McGlew and Tuttle, P.C.

(57) ABSTRACT

An electrical connector jack is provided including a body with a support portion and a plug receiving portion defining an opening. A circuit board is mounted to the support portion to position the circuit board relative to the plug receiving portion. The circuit board has interconnecting conductor circuit traces respectively extending from spring contact termination locations. A plurality of terminated spring contact conductors is provided with each terminating at a respective one of the spring contact termination locations, each of the terminated spring contact conductors having a contact zone. A plurality of supported spring contact conductors are supported by the body and extend therefrom. The supported spring contact conductors each have a plug contact zone and a terminated spring contact conductor zone. With contact of the plug contact zone with a plug, the supported spring contact conductors are respectively in contact with respective contact zones of the terminated spring contact conductors providing a transmission path from the plug to the circuit traces of the circuit board.

20 Claims, 10 Drawing Sheets

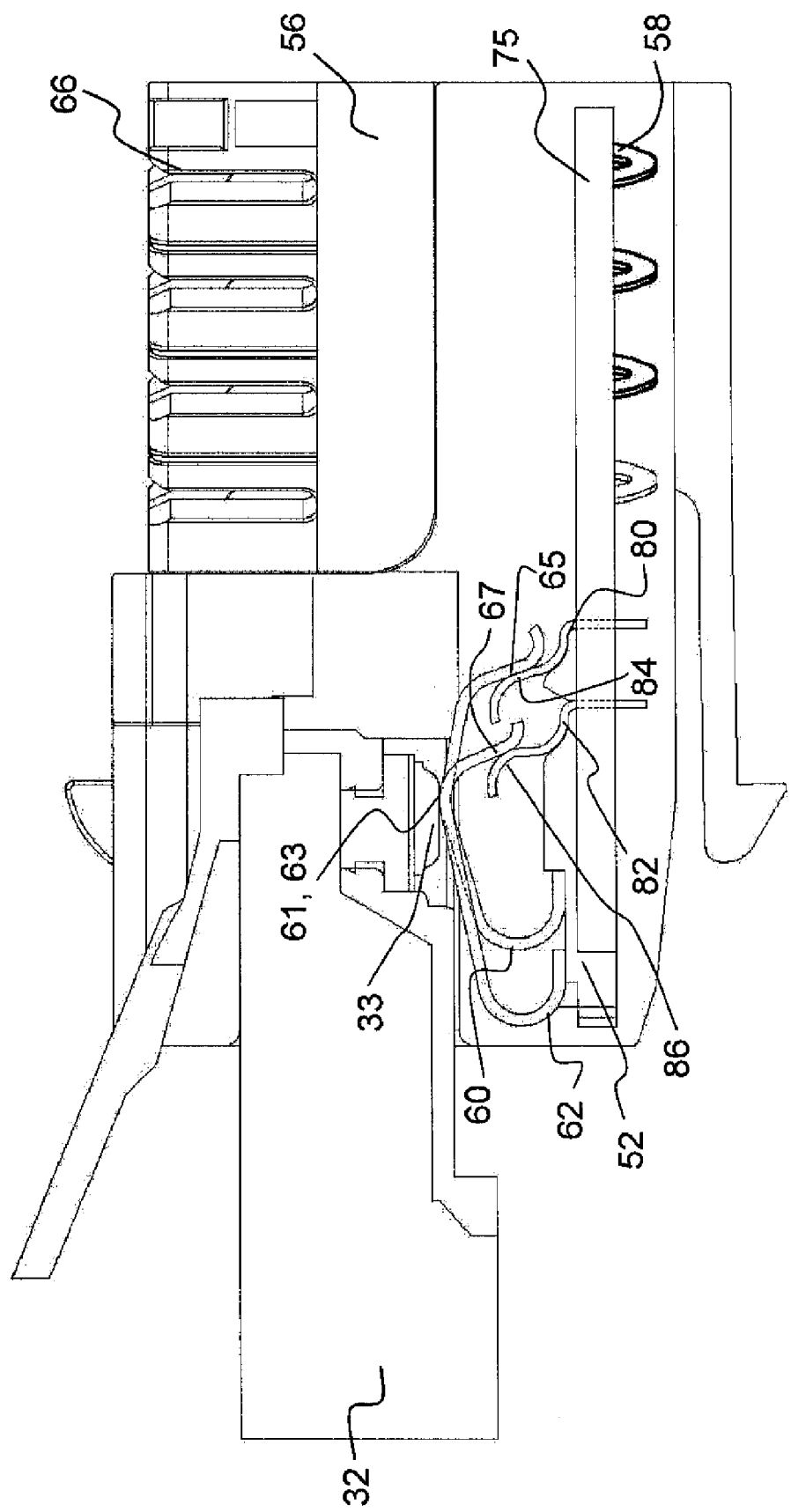

HIGH PERFORMANCE JACK

FIELD OF THE INVENTION

The present invention relates to electrical connectors such as RJ style plug and jack connectors for communications systems and more particularly to such connectors which attain a high level of throughput transmission performance such as TIA (Telecommunications Industry Association)/EIA (Electronic Industries Alliance) category six performance (CAT 6) or higher.

BACKGROUND OF THE INVENTION

The increasing Internet traffic and the increased complexity and use of web applications has forced network providers and network infrastructure managers to seek enhanced transmission speeds for network equipment. The TIA/EIA set up a high-performance cabling category to fulfill this requirement often referred to as CAT 6.

Such high-performance cabling uses a format with RJ 45 jacks and plugs. The agreed to format for the lines at such a connector involves a line with a center pair of conductors at the connector and a split pair of conductors at the connector. One conductor contact of the split pair is on each side of the center pair conductor contacts. When such an RJ 45 plug mates with an RJ 45 jack with signals at such high frequencies (as per the standard), the split pair will suffer a significant Near End Cross Talk (NEXT) problem from the other pairs.

It is known that electrical signals of one pair of conductors may be coupled onto the other pair of conductors for compensating or canceling crosstalk. JP 64[1989] 20690 (JP '690) discloses a modular telephone jack with a crosstalk prevention function where a capacitor is installed within a housing. A printed circuit board has traces connected to the capacitors and also connected between insulation displacement contacts (IDCs) and contact springs of the jack. In FIG. 4 an arrangement is shown wherein the traces are used to form a capacitor, to counteract the crosstalk. These traces cross each other with left to right crossing. Discrete capacitors may also be connected between transmission paths to compensate crosstalk (FIG. 3). JP '690 shows the use of both discrete capacitors connected to interconnecting traces of a circuit board to reduce crosstalk in jacks as well as the positioning of the interconnecting traces of the circuit boards providing capacitive interaction to reduce crosstalk.

U.S. Pat. No. 5,997,358 (US '358) discloses an electrical connector that achieves high transmission performance (CAT 6) by providing compensation stages for introducing predetermined amounts of compensation between pairs of conductors. Two or more of such compensation stages are provided. A first compensation stage adds a compensation signal that is time delayed with respect to the other compensation stages. In the first stage compensating crosstalk is introduced between the pairs of a first predetermined magnitude and phase in a given frequency. In a second stage, compensating crosstalk is introduced between pairs that has a second magnitude and phase in a given frequency. The first stage magnitude is larger than the offending crosstalk and the second stage reintroduces the offending crosstalk. US '358 uses multiple compensation stages to compensate for phase issues because, at high frequencies, compensating crosstalk cannot be introduced that is exactly 180° out of phase with the offending crosstalk.

SUMMARY OF THE INVENTION

It is an object of the invention to provide a connector jack that includes spring contacts with conductor pairs for plural lines defining an RJ style contact interface for connection with an RJ style plug and with interconnecting circuitry on a printed circuit board and with crosstalk compensation provided to achieve high levels of throughput and performance.

It is a further object of the invention to provide a solution to the desire to provide a high performance jack where the signal path between plug contact and the terminal (at which compensation may be easily applied) is preferably limited to 6.2 mm and to avoid shortening the spring contacts below 1.5 mm such that the spring contacts have the proper strength under a predefined deflection.

According to the invention, a modular jack is provided comprising a body with a support portion and a plug receiving portion defining an opening. A circuit board is mounted to the support portion to position the circuit board relative to the plug receiving portion. The circuit board has interconnecting conductor circuit traces respectively extending from spring contact termination locations. A signal path is provided from a mated plug blade through a supported contact spring and a terminal element terminated to the contact termination location.

The jack advantageously mates with a plug having plug contact blades wherein each the terminated spring contact conductor is located near a plug contact blade position of a mated plug. The terminal element may advantageously be disposed tangent to a rotation circle of the supported spring contact conductor.

According to another aspect of the invention, an electrical connector jack is provided comprising a body with a support portion and a plug receiving portion defining an opening. A circuit board is mounted to the support portion to position the circuit board relative to the plug receiving portion. The circuit board has interconnecting conductor circuit traces respectively extending from spring contact termination locations. A plurality of terminated spring contact conductors are provided, each terminating at a respective one of the spring contact termination locations. Each of the terminated spring contact conductors has a contact zone. A plurality of supported spring contact conductors are supported by the body and extend therefrom. The supported spring contact conductors each have a plug contact zone and a terminated spring contact conductor zone. With contact of the plug contact zone with a plug, the supported spring contact conductors are respectively in contact with a respective contact zone of the terminated spring contact conductors providing a transmission path from the plug to the circuit traces of the circuit board.

At least one of the supported spring contact conductors and the terminated spring contact conductors may advantageously be positioned to form a capacitance with a respective nonadjacent neighboring supported spring contact conductor and terminated spring contact conductor for compensating coupling at the plug contact zone between adjacent supported spring contact conductors and terminated spring contact conductors.

The adjacent spring contact termination locations may advantageously be spaced apart or offset on the circuit board.

The adjacent supported spring contact conductors and adjacent terminated spring contact conductors may advantageously be shaped differently or offset angularly or positionally to avoid coupling of the adjacent supported spring contact conductors and the adjacent terminated spring contact conductors.

The adjacent terminated spring contact conductors may advantageously be offset to avoid coupling with adjacent terminated spring contact conductors.

Contacting the terminated spring contact conductors and supported spring contact conductors provide a conductive path from the plug contact zone to a respective spring contact termination location and have a conductive path that is 6.2 mm or less.

With contact between the terminated spring contact conductors and the supported spring contact conductors a conductive path is provided from the plug contact zone to a respective spring contact termination location. Pairs of conductive paths form part of transmission lines.

A first/second crosstalk compensation element providing a crosstalk compensation signal between a first interconnecting conductor of one line and a second interconnecting conductor of another line may advantageously be provided. A second/first crosstalk compensation element providing a second/first crosstalk compensation signal between a second interconnecting conductor of the one line and a first interconnecting conductor of the another line may advantageously be provided. Each crosstalk compensation element may advantageously be applied at or closely adjacent to a respective termination location.

Providing crosstalk compensation between lines at a location close to the source of the crosstalk coupling is advantageous (see U.S. patent application Ser. Nos. 11/360,101 filed Feb. 23, 2006 and 11/369,257 filed Mar. 7, 2006, incorporated herein by reference). Such an introduction of a crosstalk compensation signal may be in the form of single compensating coupling applied along the transmission paths as well as staged compensating coupling applied along the transmission paths. Such single phase (one location along the transmission paths) and multi-phase (plural locations along the transmission paths) crosstalk compensation is applied at a distance from the source of the crosstalk coupling. The invention allows a minimization of the distance from the source of the crosstalk coupling to the first or only crosstalk compensation between paths of two transmission lines. This is done while also providing good spring contact force for good plug connection attributes.

The invention provides the spring contact function and the terminal function by different elements. A conventional contact spring, which could afford the predefined deflection requirement, is used to contact both with the mated module plug (RJ type plug) and the terminal element (terminated spring contact conductor). The terminal element is used to pass the signal to a PCB. By locating the terminal element very close to the plug contact point, it is possible to reduce the signal path length between the plug and the PCB terminal.

The design may advantageously locate the terminal element almost tangent to the rotation circle of the supported contact spring so that the deflection of the terminal element or the supported contact spring is minimized.

The terminal element may be parallel to the plug access axis so that the signal traveling length from the plug to PCB is reduced when a plug is mated.

The terminal element may advantageously further form a capacitor with the supported contact spring and neighboring nonadjacent terminal elements and supported contact springs to compensate the offending signal due to the crosstalk between plug blades and adjacent supported spring contacts.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 10 is a partially sectional view of the high-performance jack of FIG. 7 shown with a RJ type plug in a connected (mated) position showing only one of each type of supported spring contact conductor and one of each type of terminated spring contact conductor (and not showing other spring contact conductors in the background);

DESCRIPTION OF THE PREFERRED EMBODIMENTS

Figure 1:
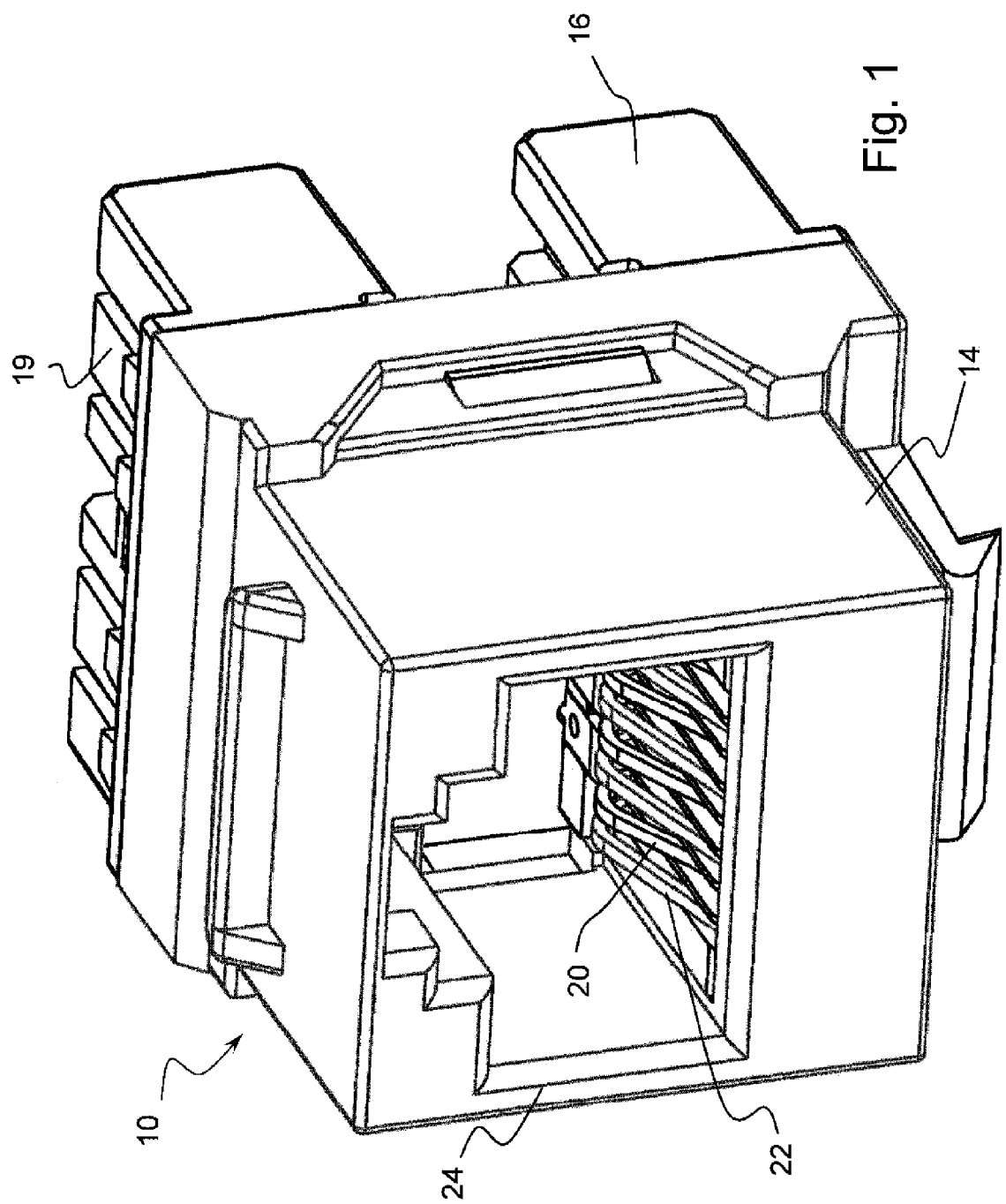
FIG. 1 is a perspective view of a high-performance jack according to the invention.
Figure 2:
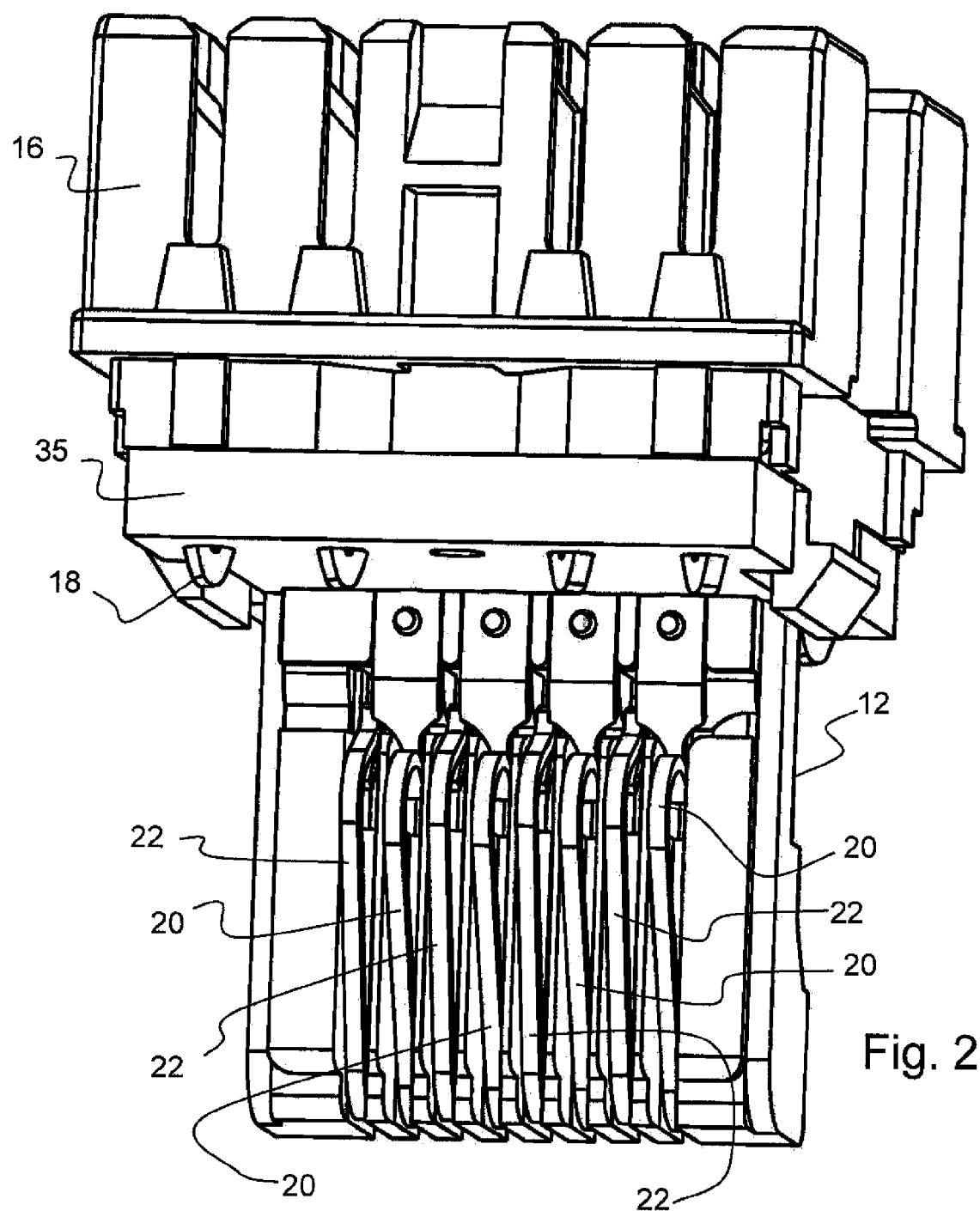
FIG. 2 is a top side view of the high-performance jack of FIG. 1 with a cover part removed.

Referring to the drawings in particular, the invention comprises a high-performance jack. A first embodiment is shown in FIG. 1 with the high-performance jack generally designated 10. The high-performance jack includes a jack body formed with a base part 12 connected to an insulation displacement contact (IDC) part 16 and a cover part 14. FIG. 2 shows the structure with the cover part 14 removed. The cover part 14 defines a plug opening 24 into which a plug 32 may be inserted in a plug insertion direction (having a plug insertion direction axis). The IDC part 16 provides support for IDCs 18 terminated to a circuit board 35. The IDC part 16 has slots 19 for terminating wires in the IDCs 28. This region may be covered with a cover part 30 (FIG. 3).

Figure 4:
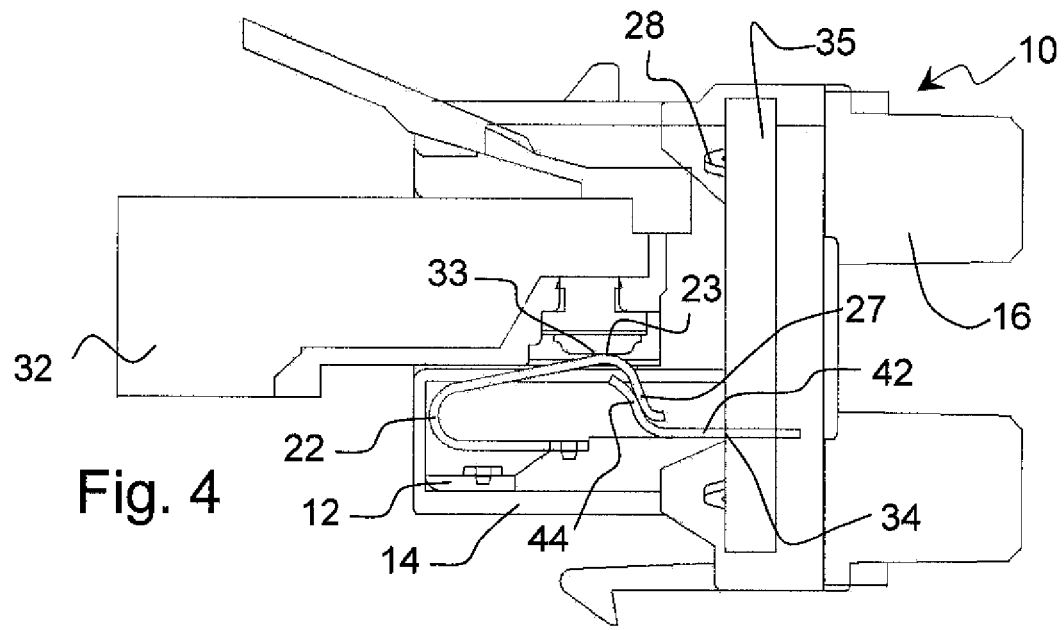
FIG. 4 is a partially sectional view of the high-performance jack of FIG. 1 shown with a RJ type plug in a connected (mated) position showing the foreground, with the background not shown.
Figure 5:
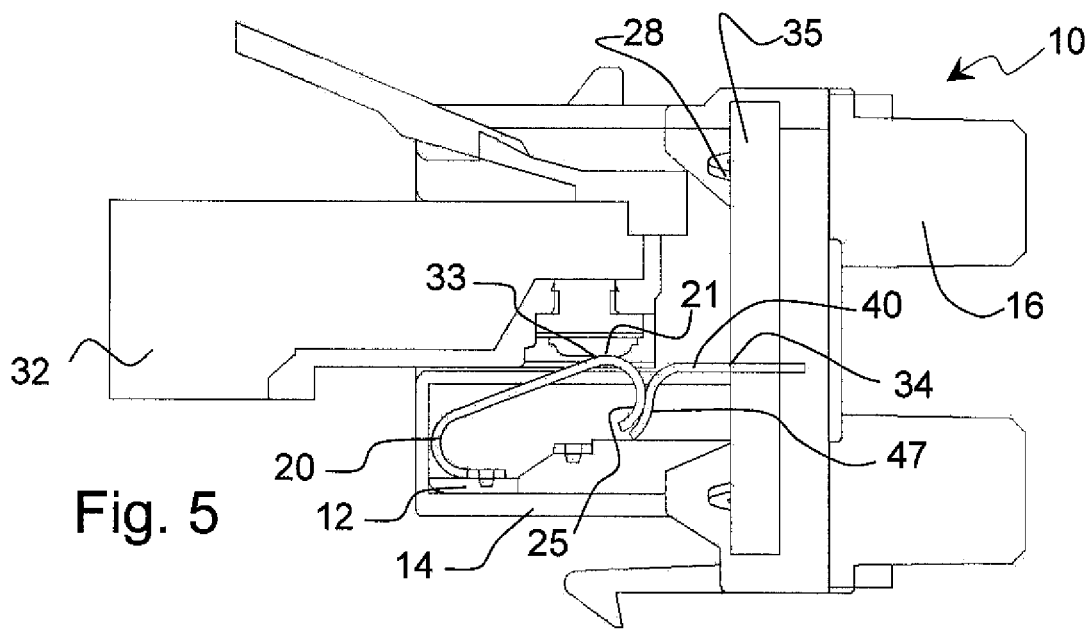
FIG. 5 is a partially sectional view of the high-performance jack of FIG. 1 shown with a RJ type plug in a connected (mated) position with the section taken in a different sectional plane than that of FIG. 4 showing the foreground, with the background not shown.

The base part 12 supports the circuit board 35 and also supports a plurality of supported spring contact conductors designated 20 and 22. As can be seen in FIGS. 4 and 5, the supported spring contact conductors 20 and 22 are fixed at one end to the base part 12 and extend as a cantilever spring from the fixed support point. The supported spring contact conductors 20 all have the same shape and the supported spring contact conductors 22 all have the same shape. The shape of the sets of conductors 20 advantageously may be different from the shape of the supported spring contact conductors 22. The spring contact conductors are arranged with every other supported spring contact conductor 20, 22 being of the shape of supported spring contact conductor 20 and every other supported spring contact conductor being the shape of supported spring contact conductor 22. With this there is less coupling between adjacent supported spring contact conductors 20 and 22. Additionally, as all of the nonadjacent neighboring supported spring contact conductors 22 have the same shape, these neighboring conductors 22 form capacitors based on some signal coupling caused by the similar shape and position of the nonadjacent supported spring contact conductors 22. As all of the nonadjacent supported spring contact conductors 20 have the same shape these form capacitors based on some signal coupling caused by the similar shape/position of the nonadjacent supported spring contact conductors 20. This can provide some compensation for crosstalk that occurs. This crosstalk particularly occurs at the plug contacts 33 and between adjacent supported spring contact conductors 20 and 22 at a plug contact region 21 of the supported spring contact conductors 20 and a plug contact region 23 of the supported spring contact conductors 22.

Figure 3:
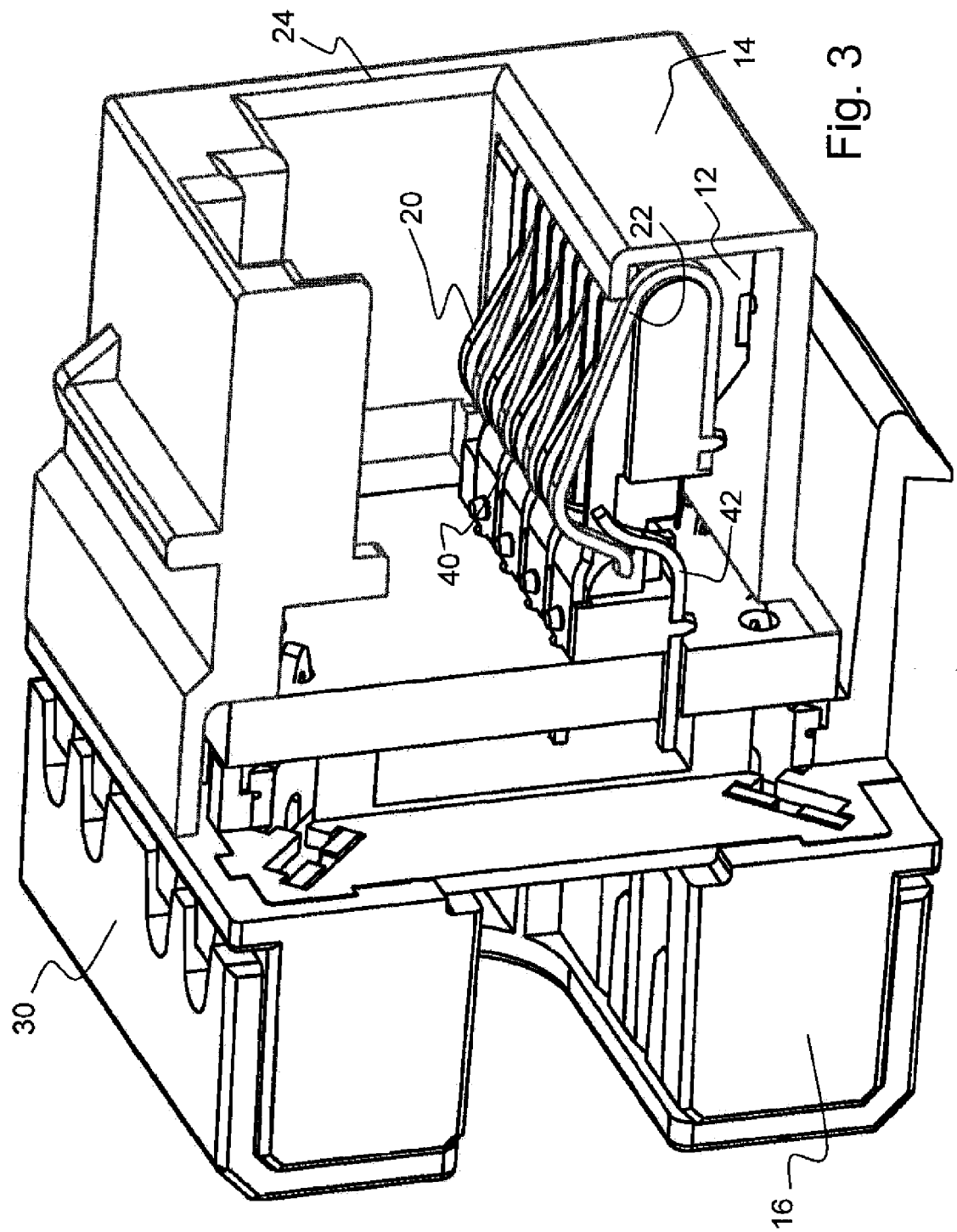
FIG. 3 is a side cutaway view of the high-performance jack of FIG. 1.

As can best be seen in FIG. 3 two different types of terminated spring contact conductors 40 and 42 are provided. Each of the terminated spring contact conductors 40 and 42 terminate at spring contact termination locations 34 on printed circuit board 35. These termination locations 34 are offset relative to adjacent termination locations 34 providing less coupling between adjacent spring contact conductors 40 and 42. Further, all of the terminated spring contact conductors 42 have the same shape and all of the terminated spring contact conductors 40 have the same shape. Based on the offset and the shaping, a capacitance is formed between nonadjacent neighboring terminated spring contact conductors 40. A capacitance is also formed between nonadjacent neighboring terminated spring contact conductors 42. This provides some compensation for crosstalk that occurs between adjacent supported spring contact conductors in the plug contact regions 21 and 23 (and that caused from the plug contacts 33).

Based on the shape and position of the spring contacts 20, 22, 40 and 42, with a RJ type plug 32 in a contact position, inserted into the opening 24 (shown in FIGS. 4 and 5), each of the contacts 20 is moved into electrical contact with a contact 40 whereby a contact surface 25 electrically contacts a contact surface 47 to provide a transmission signal path. In a similar manner with a plug 32 inserted in the contact position, each spring contact 22 is moved into electrical contact with a spring contact 42 whereby a contact surface 27 electrically contacts a contact surface 44 to provide a transmission signal path. The movement of the supported spring contact conductors 20, 22 is based on the shape of these and the insertion direction of the plug to provide each the supported spring contact conductors 20, 22 with a rotation circle or movement path. The terminal spring contacts 40 and 42 is advantageously supported almost tangent to or tangent to the respective rotation circle. The terminal spring contacts 40 and 42 may be almost parallel to the plug access or insertion axis.

With this construction, the overall transmission signal path from the plug contact zone 23 to the termination locations 34 on the circuit board may be made short. The supported spring contacts 20, 22 and to some degree the terminated spring contacts 40 and 42 contribute to the plug contact force required. Transmission paths of determined coupling and length may be advantageously provided without jeopardizing the spring contact force which is required for proper mating with the plug 32.

Figure 6B:
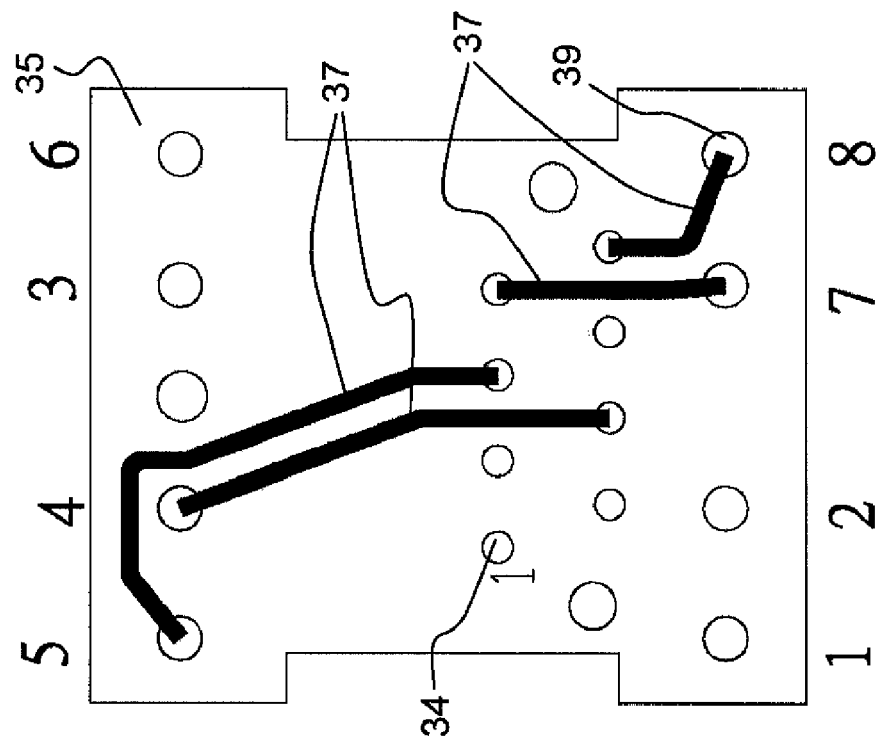
FIG. 6B is a view of the other side of the circuit board used in the embodiment of FIG. 1.
Figure 6A:
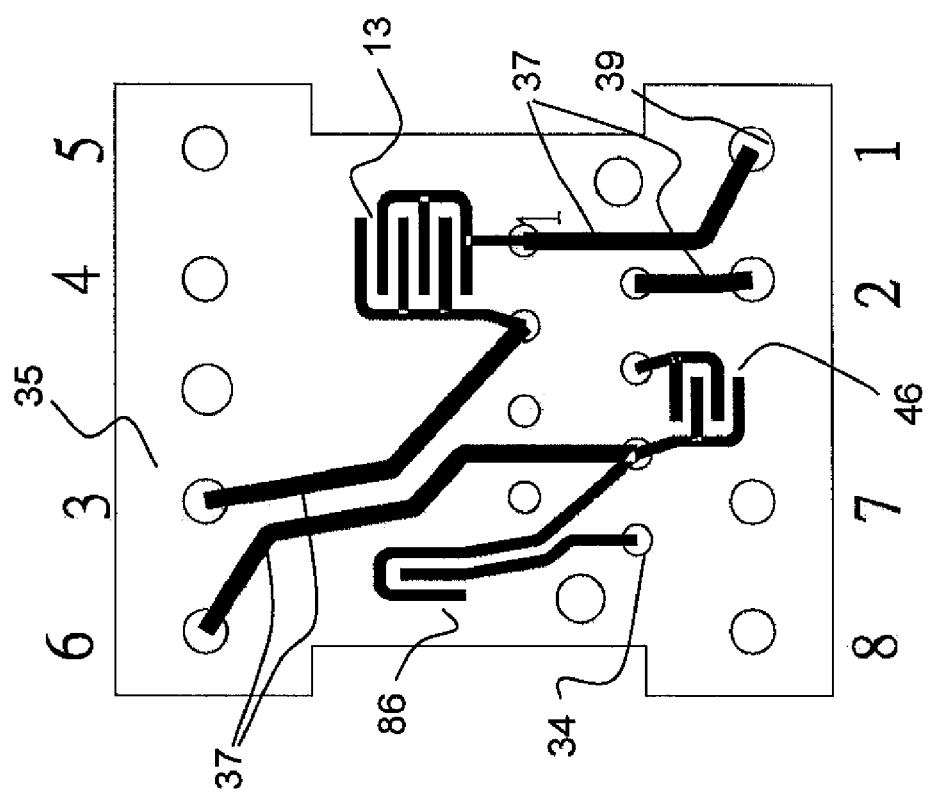
FIG. 6A is a view of one side of a circuit board used in the embodiment of FIG. 1.

FIGS. 6A and 6B respectively show a first and second side of the circuit board 35. The circuit board 35 has the termination locations 34 for each of the transmission paths numbered 1 through 8. The circuit board 35 has interconnecting conductor circuit traces 37 respectively extending from spring contact termination locations 34 to IDC termination locations 39. The conductors are provided to present transmission paths from spring contact conductors 40 and 42 to the IDCs 18. Two transmission paths together provide a transmission line. In this case, the paths 1 and 2 form a transmission line, the paths 3 and 6 form a transmission line, the paths 4 and 5 form a transmission line and the paths 7 and 8 form a transmission line. The split paths 3 and 6 are on each side of the paths 4 and 5, presenting crosstalk coupling problems at the plug and in the plug contact zone. Other crosstalk occurs between adjacent plug contacts and in adjacent supported spring contact conductors 20 and 22 in the plug contact zone. A first compensation element 46 is provided on the circuit board for compensation between the transmission paths 4 and 6 respectively of the transmission lines 3, 6 and 4, 5. A first compensation element 86 is provided on the circuit board for compensation between the transmission paths 8 and 6 respectively of the transmission lines 3,6 and 7, 8. A first compensation element 13 is provided on the circuit board for compensation between the transmission paths 1 and 3 of respectively of the transmission lines 3,6 and 1, 2. These first compensation elements 46, 86 and 13 are advantageously connected to the termination locations 34 of the respective transmission paths, providing the compensation at a short distance from the location the crosstalk is introduced.

Figure 7:
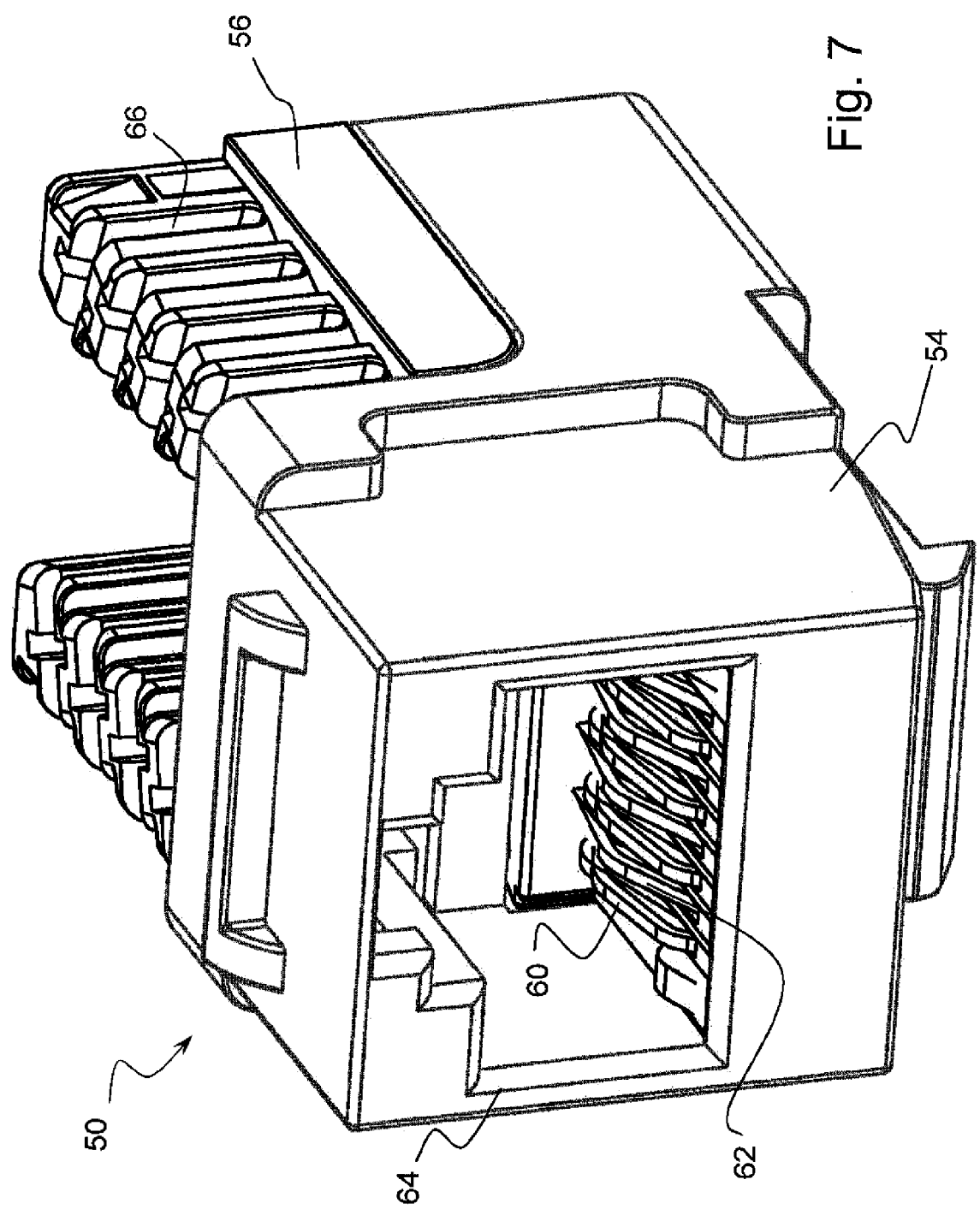
FIG. 7 is a perspective view of a high-performance jack according to another embodiment of the invention.
Figure 8:
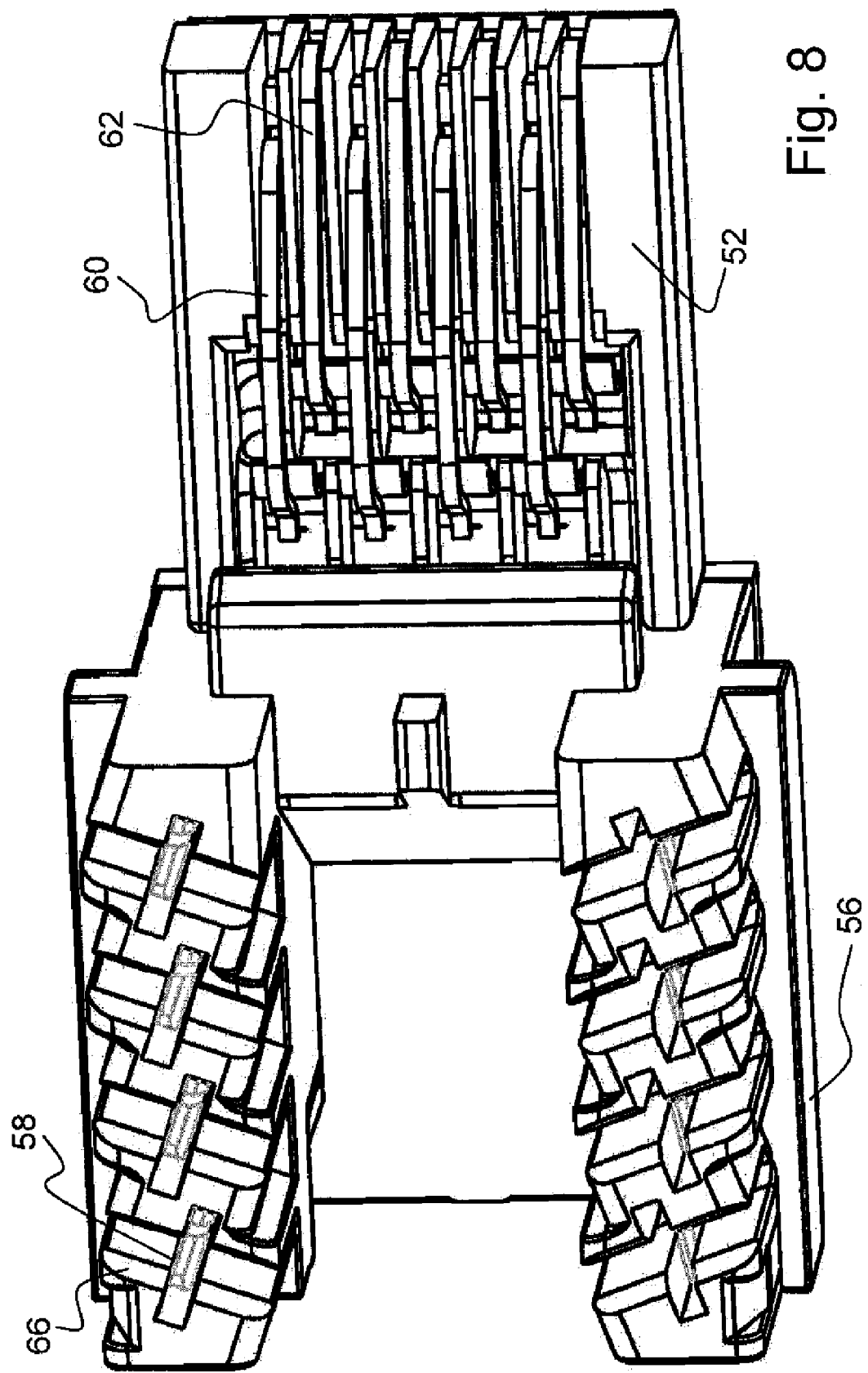
FIG. 8 is a top perspective view of the high-performance jack of FIG. 7 shown with the cover removed.

FIG. 7 shows an alternative embodiment according to the invention with a high-performance jack generally designated 50. The high-performance jack 50 includes a jack body formed with a base part 52 (see FIG. 8) connected to an insulation displacement contact (IDC) part 56 housing IDCs 58 and a cover part 54. The IDC part 56 has slots 66 for terminating wires to IDCs. FIG. 8 shows the structure with the cover part 54 removed showing the base part 52 supporting a plurality of supported spring contact conductors designated 60 and 62. As can be seen in FIG. 10, the supported spring contact conductors 60 and 62 are fixed at one end to the base part 52 and extend as a cantilever spring from the fixed support point. The supported spring contact conductors 60 all have the same shape and the supported spring contact conductors 62 all have the same shape with the shape of the sets of conductors 60 different from the shape of the supported spring contact conductors 62. The spring contact conductors 60, 62 are arranged alternating between supported spring contact conductors 60 and 62 providing less coupling between adjacent supported spring contact conductors 60 and 62. Additionally, as all of the nonadjacent neighboring supported spring contact conductors 62 have the same shape, these neighboring conductors form capacitors. The same is the case with the nonadjacent neighboring supported spring contact conductors 60 to provide some compensation for crosstalk that occurs (at the plug contacts and between contact conductors at a plug contact regions 61 and 63).

Figure 9:
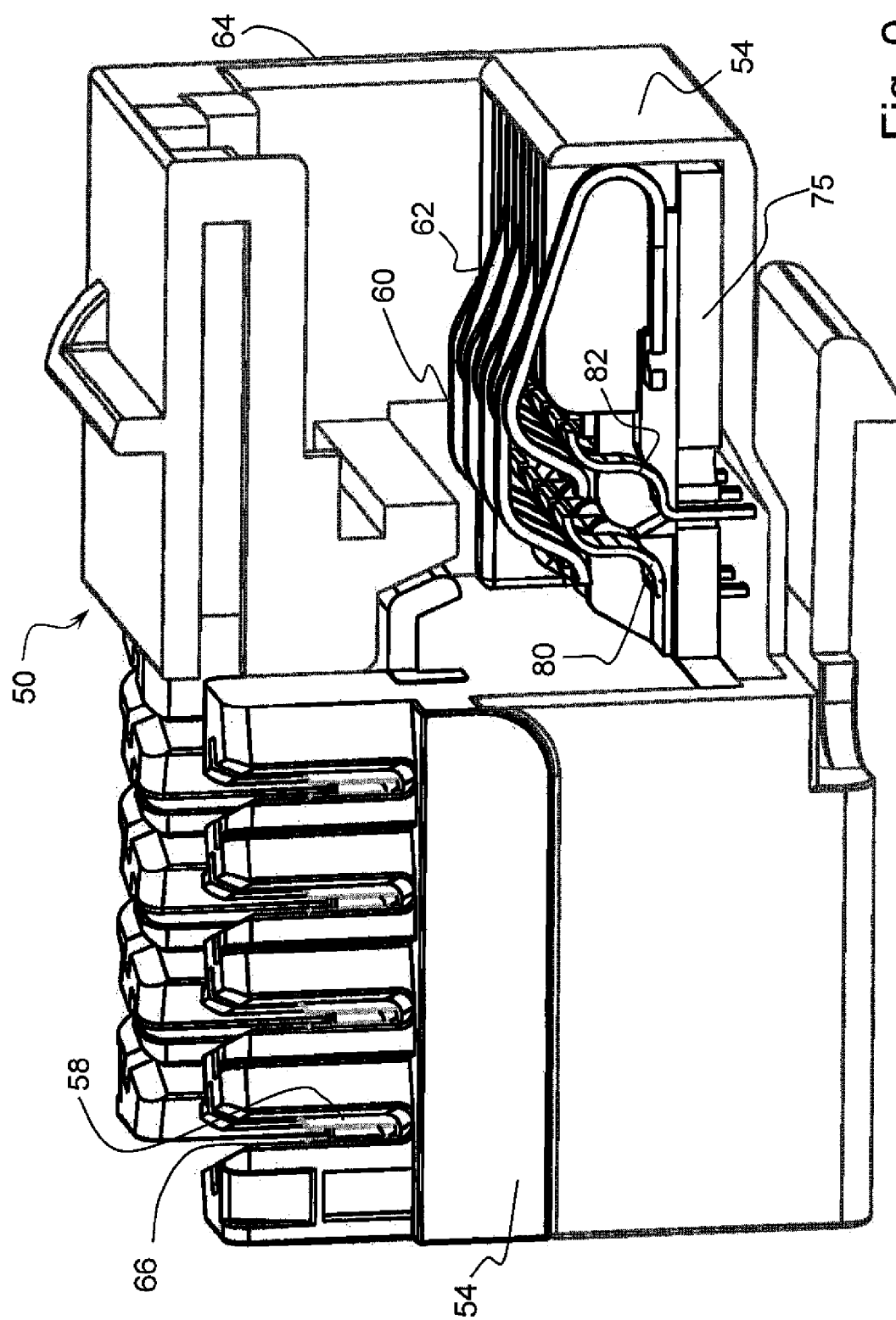
FIG. 9 is a side cutaway view of the high-performance jack of FIG. 7.

As can best be seen in FIG. 9 two different types of terminated spring contact conductors 80 and 82 are provided. Each of the terminated spring contact conductors 80 and 82 terminate at spring contact termination locations 34 on printed circuit board 75. These termination locations 34 are offset relative to adjacent termination locations 34 providing less coupling between adjacent spring contact conductors 80 and 82. Further, all of the terminated spring contact conductors 82 have the same shape and all of the terminated spring contact conductors 80 have the same shape. In this embodiment with the offset of the termination locations 34, the basic shape of the spring contact conductors 80 and 82 is the same. Based on the offset, a capacitance is formed between nonadjacent neighboring terminated spring contact conductors 80 and a capacitance is formed between nonadjacent neighboring terminated spring contact conductors 82. This provides some compensation for crosstalk that occurs between adjacent supported spring contact conductors plug contact region 61 and plug contact region 63 (and compensation for crosstalk that occurs between plug contacts).

Based on the shape and position of the spring contacts 60, 62, 80 and 82, with a plug 32 in a contact position, inserted into the opening 64, each of the contacts 60 is moved into electrical contact with a contact 80 whereby a contact surface 65 electrically contacts a contact surface 84 to provide a transmission signal path. In a similar manner with a plug 32 inserted in the contact position, each spring contact 62 is moved into electrical contact with a spring contact 82 whereby a contact surface 67 electrically contacts a contact surface 86 to provide a signal transmission signal path. The movement of the supported spring contact conductors 60, 62 is based on the shape of these and the insertion direction of the plug to provide each of the supported spring contact conductors 60, 62 with a rotation circle or movement path. The terminal spring contacts 80 and 82 is advantageously supported almost tangent to or tangent to the respective rotation circle. The terminal spring contacts 80 and 82 may be almost parallel to the plug access or insertion axis.

With this construction, the overall transmission signal path from the plug contact zone 61, 63 to the termination locations on the circuit board may be made short. The supported spring contacts 60, 62 and to some degree the terminated spring contacts 80 and 82 contribute to the plug contact force required. Transmission paths of determined coupling and length may be advantageously provided without jeopardizing the spring contact force which is required for proper mating with the plug 32.

Figure 11B:
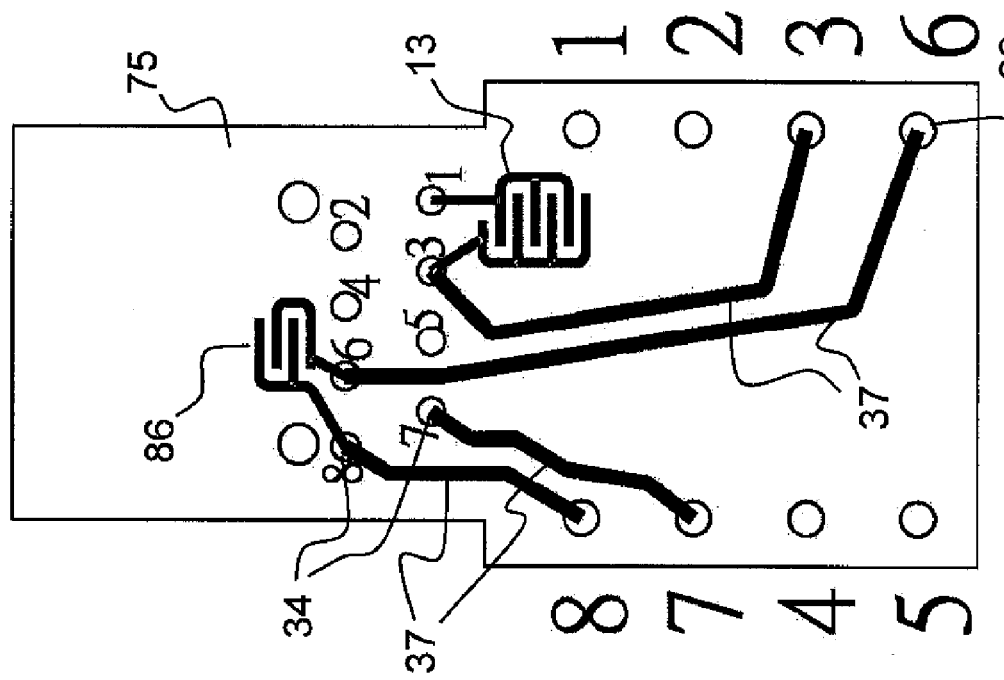
FIG. 11B is a view of the other side of the circuit board used in the embodiment of FIG. 7.
Figure 11A:
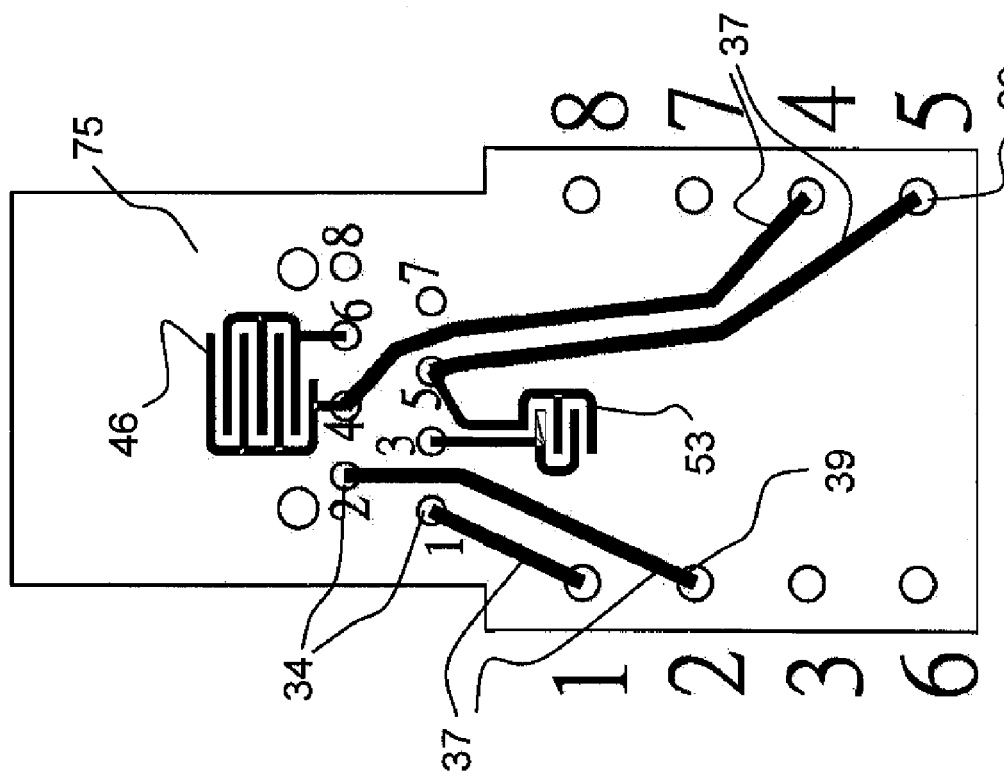
FIG. 11A is a view of the other side of the circuit board used in the embodiment of FIG. 7.

FIGS. 11A and 11B respectively show a first and second side of the circuit board 75. The circuit board 75 has the termination locations 34 for each of various transmission paths numbered 1 through 8. The circuit board 75 has interconnecting conductor circuit traces 37 respectively extending from spring contact termination locations 34 to IDC termination locations 39. The transmission paths numbered 1 to 8 are from spring contact conductors 60 and 62 to the IDCs 58. Two transmission paths together provide a transmission line. In this case, the paths 1 and 2 form a transmission line, the paths 3 and 6 form a transmission line, the paths 4 and 5 form a transmission line and the paths 7 and 8 form a transmission line. The split paths 3 and 6 are on each side of the paths 4 and 5, presenting problems as to crosstalk coupling at the plug and in the plug contact zone. Other crosstalk occurs between adjacent plug contacts and in adjacent supported spring contact conductors 60 and 62 in the plug contact zone. A first compensation element 46 is provided on the circuit board for compensation between the transmission paths 4 and 6 respectively of the transmission lines 3,6 and 4, 5. In this embodiment another first compensation element 53 is provided on the circuit board for compensation between the transmission paths 5 and 3 respectively of the transmission lines 4, 5 and 3, 6. A first compensation element 86 is provided on the circuit board for compensation between the transmission paths 8 and 6 respectively of the transmission lines 3,6 and 7, 8. A first compensation element 13 is provided on the circuit board for compensation between the transmission paths 1 and 3 of respectively of the transmission lines 3,6 and 1, 2. These first compensation elements 46, 53, 86 and 13 are advantageously connected to the termination locations 34 of the respective transmission paths, providing the compensation at a short distance form the location the crosstalk is introduced.

While specific embodiments of the invention have been shown and described in detail to illustrate the application of the principles of the invention, it will be understood that the invention may be embodied otherwise without departing from such principles.

What is claimed is:

1. An electrical connector jack comprising:
   a body with a support portion and a plug receiving portion defining an opening;
   a circuit board mounted to said support portion to position said circuit board relative to said plug receiving portion, said circuit board having interconnecting conductor circuit traces respectively extending from spring contact termination locations; and
   a plurality of terminated spring contact conductors each terminating at a respective one of said spring contact termination locations, each of said terminated spring contact conductors having a contact zone;
   a plurality of supported spring contact conductors supported by said body and extending therefrom, said supported spring contact conductors each having a plug contact zone and a terminated spring contact conductor zone, wherein with contact of said plug contact zone with a plug, said supported spring contact conductors are respectively in contact with respective said contact zones of said terminated spring contact conductors providing a transmission path from said plug to said circuit traces of said circuit board.

2. An electrical connector jack according to claim 1, wherein:
   at least one of said supported spring contact conductors and said terminated spring contact conductors are positioned to form a capacitance with a respective nonadjacent neighboring supported spring contact conductor and terminated spring contact conductor for compensating coupling at said plug contact zone between adjacent supported spring contact conductors and terminated spring contact conductors.

3. An electrical connector jack according to claim 2, wherein: adjacent said spring contact termination locations are spaced apart or offset on said circuit board.

4. An electrical connector jack according to claim 1, wherein: adjacent said supported spring contact conductors and adjacent said terminated spring contact conductors are shaped differently or offset angularly or positionally to avoid coupling of adjacent said supported spring contact conductors and adjacent said terminated spring contact conductors.

5. An electrical connector jack according to claim 3, wherein: adjacent said terminated spring contact conductors are offset to avoid coupling with adjacent terminated spring contact conductors.

6. An electrical connector jack according to claim 1, wherein contacting said terminated spring contact conductors and supported spring contact conductors provide a conductive path from said plug contact zone to a respective said spring contact termination location and have a conductive path that is 6.2 mm or less.

7. An electrical connector jack according to claim 1, wherein contacting said terminated spring contact conductors and supported spring contact conductors provide a conductive path from said plug contact zone to a respective said spring contact termination location and wherein pairs of conductive paths form part of transmission lines and further comprising: a first/second crosstalk compensation element providing a crosstalk compensation signal between a first interconnecting conductor of one line and a second interconnecting conductor of another line, said crosstalk compensation element being applied at or closely adjacent to a respective said termination location.

8. An electrical connector according to claim 7, further comprising a second/first crosstalk compensation element providing a second/first crosstalk compensation signal between a second interconnecting conductor of said one line and a first interconnecting conductor of said another line, wherein said first/second crosstalk compensation element and said second/first crosstalk compensation element are the only compensation element connected between said first line and said second line on said circuit board.

9. An electrical connector according to claim 7, further comprising another crosstalk compensation element providing a second phase crosstalk compensation signal between an interconnecting conductor of said first line and an interconnecting conductor of said second line.

10. An electrical connector according to claim 9, wherein said another crosstalk compensation element providing a further crosstalk compensation signal is applied less than 7.2 mm from a termination location of the interconnecting conductor of said one line and the interconnecting conductor of said second line.

11. An electrical connector according to claim 9, wherein each of said interconnecting conductors is connected to another termination location and said another crosstalk compensation element providing a further crosstalk compensation signal is applied at two of said another termination locations.

12. A connector jack according to claim 1, further comprising:
plural insulation displacement contacts wherein each of said interconnecting conductors is connected to a respective another termination location and each of said insulation displacement contacts is terminated to a respective another termination locations, said body cooperating with said insulation displacement contacts to form wire receiving slots for terminating wires to said insulation displacement contacts.

13. A connector jack according to claim 1, further comprising a plug having plug contact blades wherein each said terminated spring contact conductor is located near a plug contact blade.

14. A connector jack according to claim 1, wherein at least some of each said terminated spring contact conductor are disposed tangent to a rotation circle of the supported spring contact conductor.

15. A connector jack according to claim 1, where the terminal element is almost parallel to a plug access axis.

16. A modular jack comprising:
a body with a support portion and a plug receiving portion defining an opening;
a circuit board mounted to said support portion to position said circuit board relative to said plug receiving portion, said circuit board having interconnecting conductor circuit traces respectively extending from spring contact termination locations to contact termination locations;
a plurality of contact springs, each of said contact springs being supported by said body; and
a plurality of terminal elements, each of said terminal elements being terminated to a respective one of said spring contact termination locations, each of said contact springs being brought into electrical contact with a respective one of said terminal elements upon a plug being mated in said plug receiving portion to define a signal path from a mated plug blade through a respective said supported contact spring and a respective said terminal element terminated to a respective one of said contact termination locations.

17. A modular jack according to claim 16, wherein the jack mates with a plug having plug contact blades wherein each said terminated spring contact conductor is located near a plug contact blade position of a mated plug.

18. A modular jack according to claim 16, wherein said terminal element is disposed tangent to a rotation circle of the supported spring contact conductor.

19. A modular jack according to claim 16, wherein the terminal element is almost parallel to a plug access axis.

20. A modular jack according to claim 16, wherein non adjacent contact springs are shaped to form a capacitor to compensate an offending signal due to the crosstalk between plug blades of a mated plug.

* * * * *